(12) United States Patent
Shkidt et al.

(10) Patent No.: US 7,863,981 B2
(45) Date of Patent: Jan. 4, 2011

(54) RAIL-TO-RAIL OPERATIONAL AMPLIFIER

(75) Inventors: Alexei Shkidt, Newark, CA (US); Omer Fatih Orberk, Istanbul (TR)

(73) Assignee: Spectra Linear, Inc., Santa Clara, CA (US)

( * ) Notice: Subject to any disclaimer, the term of this patent is extended or adjusted under 35 U.S.C. 154(b) by 0 days.

(21) Appl. No.: 12/416,459

(22) Filed: Apr. 1, 2009

(65) Prior Publication Data

US 2009/0251214 A1    Oct. 8, 2009

Related U.S. Application Data

(60) Provisional application No. 61/041,820, filed on Apr. 2, 2008.

(51) Int. Cl.
*H03F 3/45* (2006.01)
(52) U.S. Cl. ..................... 330/255; 330/253
(58) Field of Classification Search .............. 330/207 P, 330/253, 255, 298
See application file for complete search history.

(56) References Cited

U.S. PATENT DOCUMENTS 6,366,167 B1 * 4/2002 Stockstad .................. 330/253

OTHER PUBLICATIONS

T. Stockstad et al., "A 0.9-V 0.5- μA Rail-to-Rail CMOS Operational Amplifier", IEEE Journal of Solid-State Circuits, vol. 37, No. 3, Mar. 2002, pp. 286-292.

* cited by examiner

*Primary Examiner*—Khanh V Nguyen
(74) *Attorney, Agent, or Firm*—Holland & Hart LLP

(57) ABSTRACT

A rail-to-rail operational amplifier has a pair of input terminals and an output terminal, and includes first and second parallel-connected differential input stages configured to generate a differential output signal OUTN, OUTP in response to a differential input signal VINN, VINP received at the pair of input terminals. Each of the first and second differential input stages in turn includes a pair of source-follower transistors and a pair of bulk-driven transistors. The pair of source-follower transistors are respectively coupled between the pair of input terminals and a bulk terminal of the pair of bulk-driven input transistors. Further, the pair of source-follower transistors in the first differential input stage have a different threshold voltage than the source-follower transistors in the second differential input stage.

25 Claims, 6 Drawing Sheets

US 7,863,981 B2

RAIL-TO-RAIL OPERATIONAL AMPLIFIER

CROSS-REFERENCES TO RELATED APPLICATIONS

This application claims priority from co-pending U.S. Provisional Patent Application No. 61/041,820, filed Apr. 2, 2008, entitled "RAIL-TO-RAIL OPERATIONAL AMPLIFIER", which is hereby incorporated by reference, as if set forth in full in this document, for all purposes.

BACKGROUND

The present invention relates generally to integrated circuits, and more particularly to operational amplifier circuits.

It is often desirable in today's rapidly changing semiconductor technology to design for circuit operability over a wide range of power supplies. Reduced power consumption with low power supplies may be particularly desirable for many applications. To decrease research, development, and manufacturing costs, single chip solutions for both high and low supplies are often targeted when developing various system elements. However, low supply voltage levels may have detrimental effect on analog component operational characteristics.

Particularly, operational amplifiers may perform poorly in environments providing low supply voltage levels. For example, analog transistors in the operational amplifier may manifest poor performance characteristics at low level operational voltages. Consistency in transconductance characteristics across the full range of input voltages is often sacrificed in the low voltage operational environment.

It may be desirable to have an operational amplifier capable of operating in a low voltage environment that would retain essential operational characteristics, for example, those derived from certain input analog transistors. It may also be desirable to have an operational amplifier capable of maintaining substantially constant transconductance characteristics across a full range of input voltage levels while maintaining a high level of input impedance. Additionally, it may be desirable to provide an operational amplifier capable of avoiding dead band behavior commonly found in "rail-to-rail" input stages.

BRIEF SUMMARY

In accordance with embodiments of the invention, among other advantages and features, a rail-to-rail operational amplifier has a wide input common mode range that ensures high input impedance along a full range of input voltage levels.

In one embodiment, a rail-to-rail operational amplifier includes two independent but parallel connected differential input stages with their differential input terminals coupled together (i.e., their positive input terminals are coupled together and their negative input terminals are coupled together) and their differential output terminals coupled together (i.e., their positive output terminals are coupled together and their negative output terminals are coupled together). One or both of the two differential input stages are coupled to a replica biasing stage which is a replica of a portion of the corresponding differential input stage. The operational amplifier further includes a folded cascode stage coupled to the common positive output terminal and the common negative output terminal of the two parallel connected differential input stages, and configured to sum the output currents from the two parallel connected differential input stages. The cascode stage is further configured to convert the differential signal from the differential input stages to a single ended signal which is in turn provided to an output gain stage. The output gain stage is configured to drive a capacitive load and to increase the total gain. A biasing circuit provides the biasing signals for the various stages in the operational amplifier.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components (e.g., a lower-case character). If only the first reference label is used in the specification, the description is applicable to any one of the similar components having the same first reference label irrespective of the second reference label.

DETAILED DESCRIPTION

Among other things, embodiments include systems and methods for providing operational amplifier functionality. In some embodiments, an operational amplifier is provided that is capable of operating in a low voltage environment, while retaining certain operational characteristics, including those derived from certain input analog transistors. In other embodiments, the operational amplifier is capable of maintaining substantially constant transconductance characteristics across a full range of input voltage levels, while maintaining a high level of input impedance. In still other embodiment, the operational amplifier is capable of avoiding dead band behavior that may commonly be found in rail-to-rail input stages.

Figure 1:
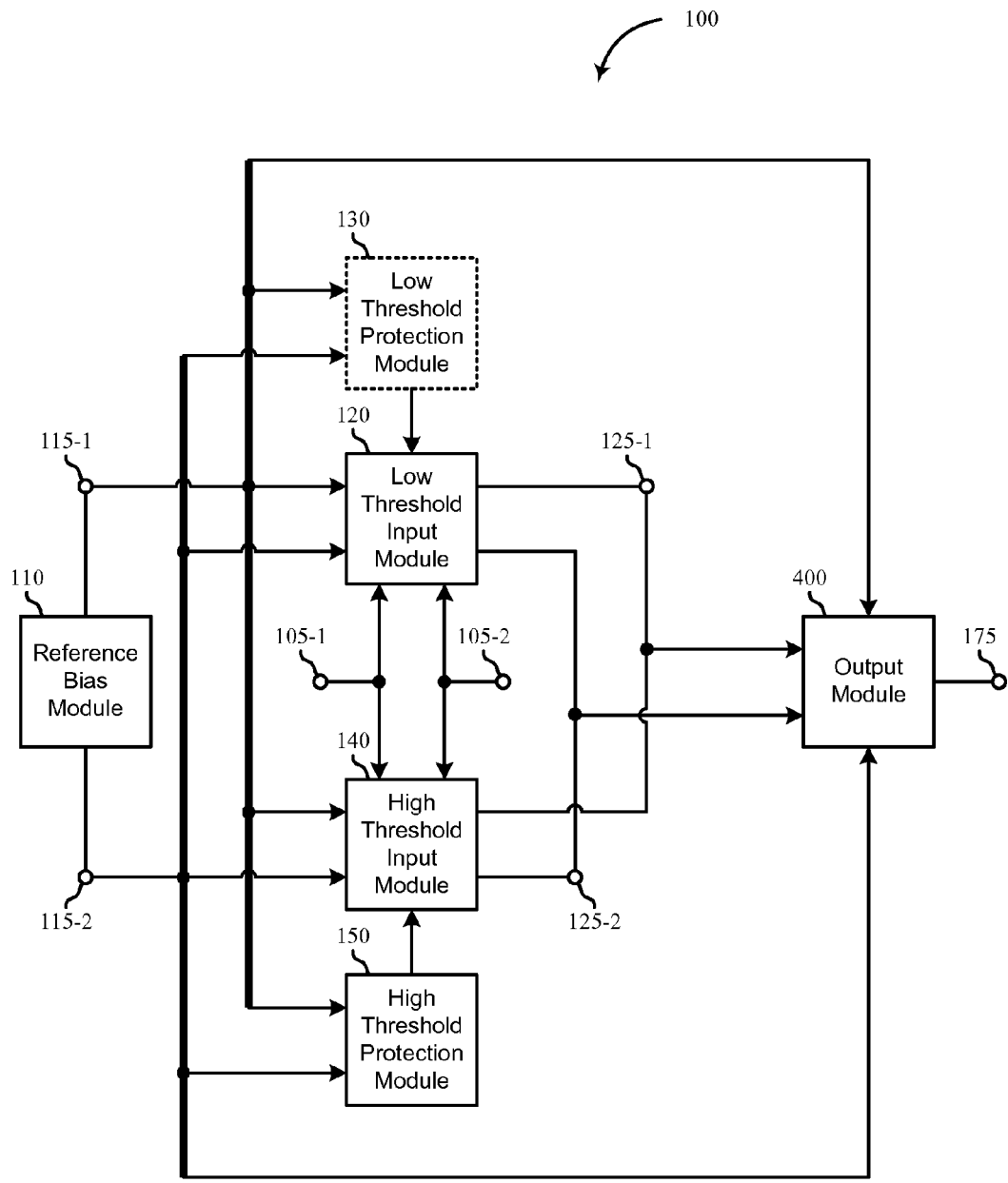
FIG. 1 shows a simplified block diagram of an operational amplifier, according to various embodiments of the invention.

Turning first to FIG. 1, a simplified block diagram of an operational amplifier 100 is shown, according to various embodiments of the invention. The operational amplifier 100 includes a reference bias module 110, a low threshold input module 120, a low threshold protection module 130, a high threshold input module 140, a high threshold protection module 150, and an output module 400. The operational amplifier 100 includes two input nodes 105 (e.g., a positive input node 105-1 and a negative input node 105-2) and an output node 175.

Embodiments of the reference bias module 110 generate reference levels for use by other components of the operational amplifier 100. In some embodiments, the reference bias module 110 generates a positive bias level on a positive bias node 115-1 and a negative bias level on a negative bias node 115-2. The positive bias level and the negative bias level may each provide a relatively constant and consistent level for biasing each functional block of the operational amplifier 100, for example, to provide reliable current levels across the functional blocks.

In some embodiments, each of the low threshold input module 120 and the high threshold input module 140 is differentially connected with both input nodes 105, and configured to generate a positive differential output level at positive differential output node 125-1 and a negative differential output level at a negative differential output node 125-2. The low threshold input module 120 is optimized for lower common mode voltage levels, where the common mode voltage level is a function of the differential voltage between the positive input node 105-1 and the negative input node 105-2. For example, the common mode voltage level may be defined as half the sum of the voltage magnitudes at the positive input node 105-1 and the negative input node 105-2. The high threshold input module 140 may be optimized for higher common mode voltage levels.

In one embodiment, the transistors in the low threshold input module 120 are native NMOS transistors (e.g., with threshold voltages in the range of −200 mV to +100 mV) and the transistors in the high threshold input module 140 are regular NMOS transistors (e.g., with threshold voltages in the range of 0.6V to 1V). For example, native transistors may be manufactured by blocking receipt of channel doping that may typically be introduced in the channel region of regular NMOS transistors. In another embodiment, depletion type transistors (e.g., with threshold voltages of 0V or negative) are used in the low threshold input module 120. In these configurations, the low threshold input module 120 and the high threshold input module 140 both may deliver high gain in mid-level common mode ranges, the low threshold input module 120 may provide optimized gain performance at common mode levels close to ground, and the high threshold input module 140 may provide optimized gain performance at common mode ranges close to the supply voltage. In this way, the operational amplifier 100 may perform desirably over substantially the entire common mode range from ground to supply voltage.

Because the low threshold input module 120 and the high threshold input module 140 are optimized for different threshold voltage levels, it may be desirable to utilize those differences in optimizing operation of the operational amplifier 100 over a large range of common mode voltages. In some embodiments, as the common mode voltage decreases, the high threshold protection module 150 reduces or eliminates the effect of the high threshold input module 140 on the operational amplifier 100 functionality.

For example, as the common mode voltage decreases, certain parasitic effects (e.g., an apparent parasitic bi-polar effect) may begin to affect operation of the operational amplifier 100. Reducing the effect of the high threshold input module 140 by using the high threshold protection module 150 may mitigate the parasitic effects. This may shift operation of the operational amplifier 100 in favor of the low threshold input module 120, which may be optimized for the lower common mode voltages.

In certain embodiments, the low threshold input module 120 is configured so that there is no need for a low threshold protection module 130. In these embodiments, the operational amplifier 100 may be provided without a low threshold protection module 130. In other embodiments, however, a low threshold protection module 130 is provided. As the common mode voltage continues to drop, the low threshold protection module 130 reduces the effect of the low threshold input module 120 on the operation of the operational amplifier 100.

In some embodiments, the positive differential output node 125-1 and the negative differential output node 125-2 are in communication with the output module 160, which is configured to generate an output signal having certain output characteristics. In certain embodiments, the output module 400 includes components configured to generate a single-ended output signal that is a function of the summation of the levels on the differential output nodes 125. The summing may be implemented using different topologies, depending, for example, on performance of the topology at different input voltage levels. In one embodiment, the summing is implemented as a folded cascode topology. In another embodiment, the summing is implemented as an operational transconductance amplifier. Embodiments of the output module 400 may also be configured to provide a certain amount of gain, output impedance, noise immunity, etc. In some embodiments, the output module 400 includes stabilization elements (e.g., a stabilization capacitor) for use of the operational amplifier 100 in certain applications, for example, in a closed-loop buffer configuration.

Figure 2:
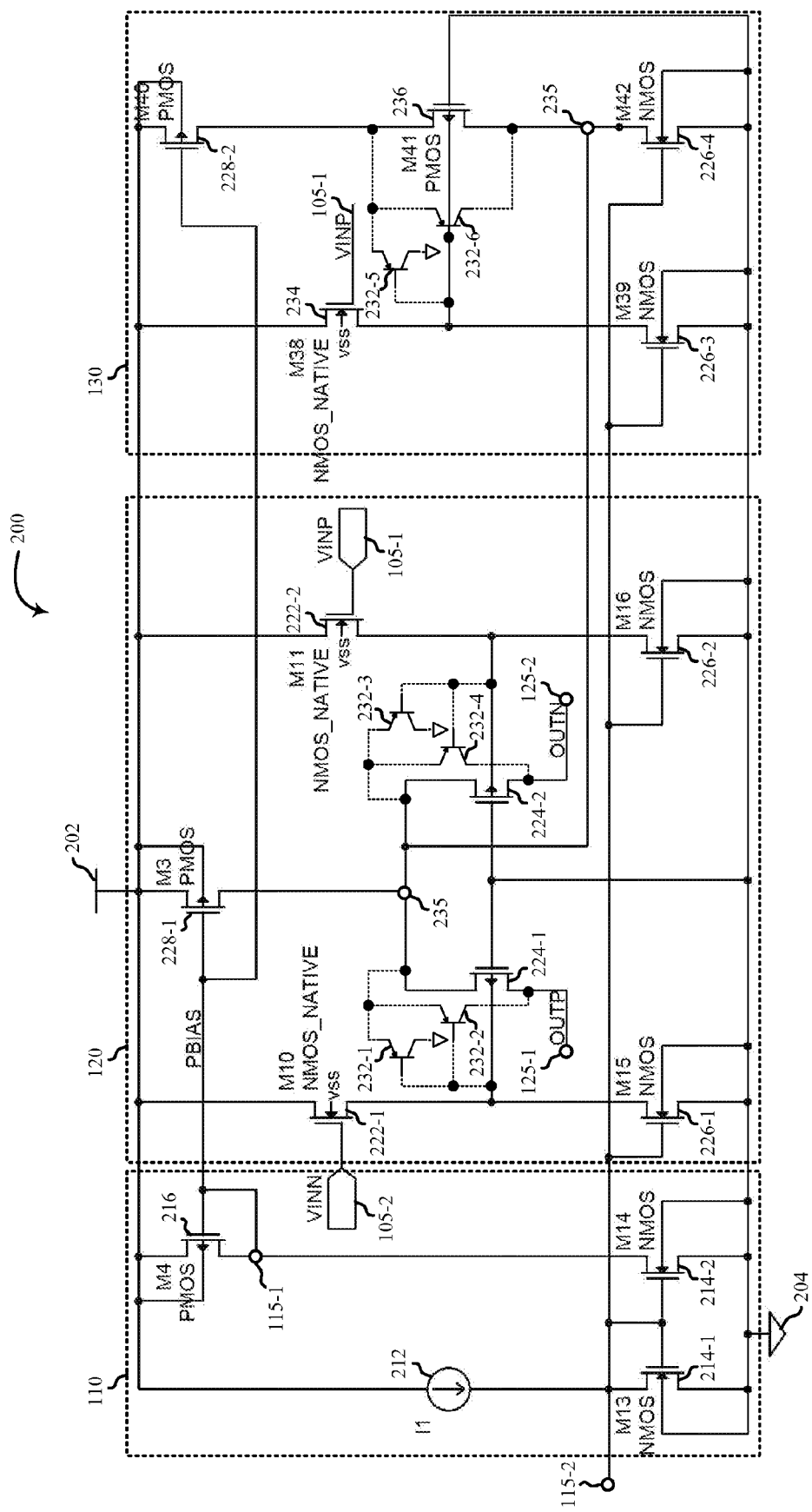
FIG. 2 shows a schematic diagram of an embodiment of a first portion of an operational amplifier, according to various embodiments of the invention.
Figure 3:
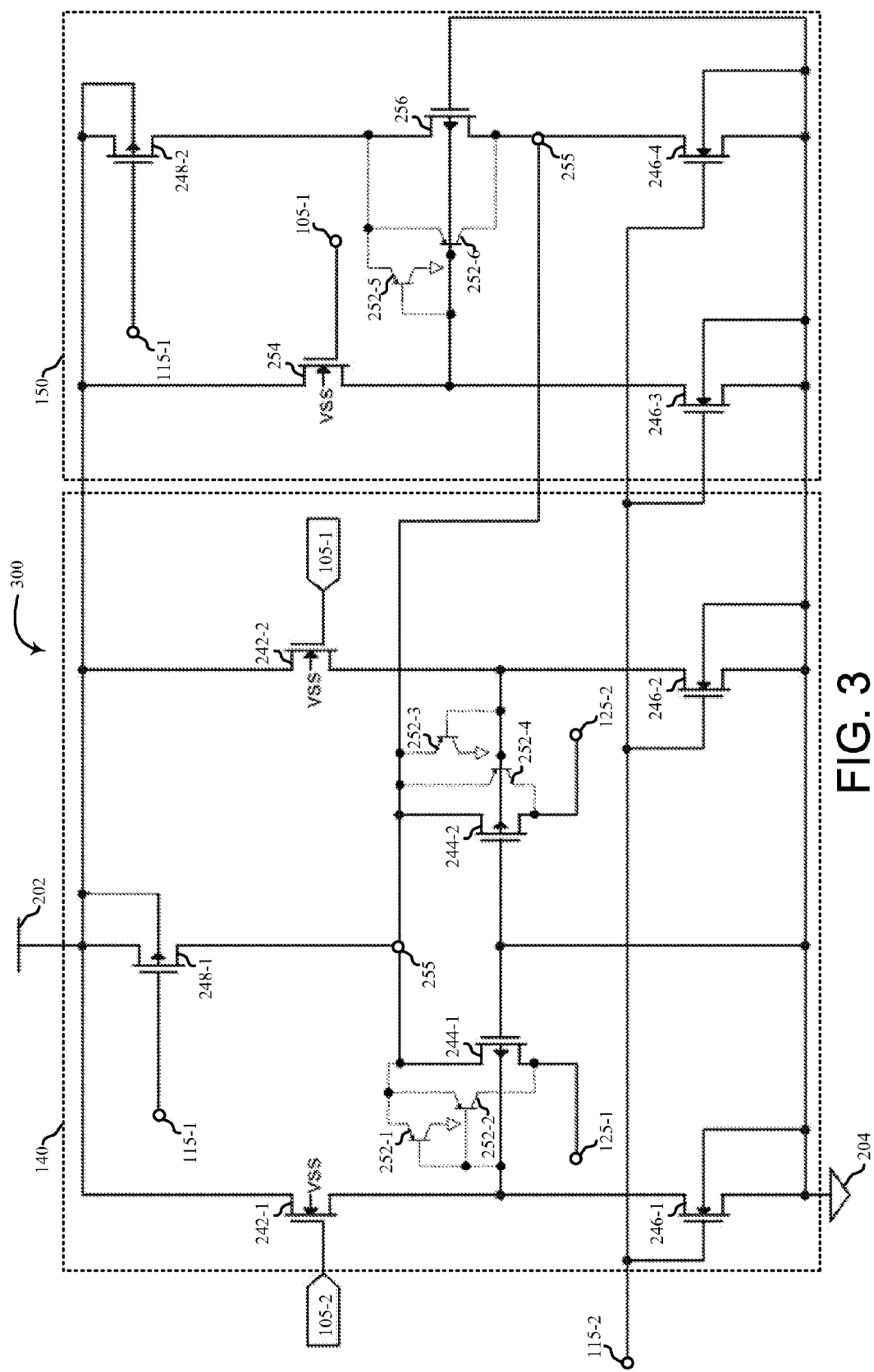
FIG. 3 shows a schematic diagram of an embodiment of a second portion of an operational amplifier, according to various embodiments of the invention.
Figure 4:
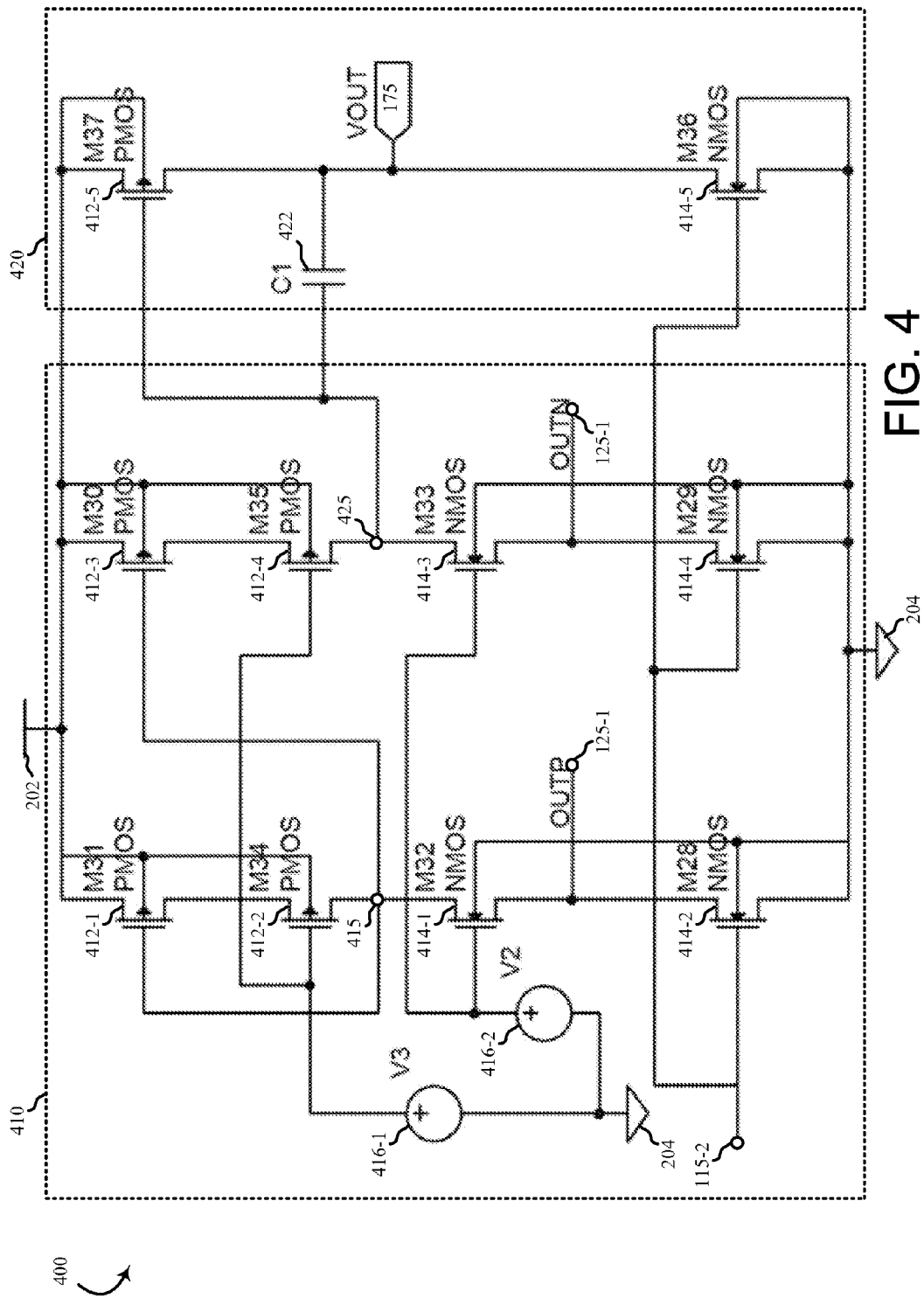
FIG. 4 shows a schematic diagram of an embodiment of an output module of an operational amplifier, according to various embodiments of the invention.

It will be appreciated that many implementations of the various blocks of the operational amplifier 100 are possible, according to various embodiments. One such implementation is illustrated in FIGS. 2-4. FIG. 2 shows a schematic diagram of an embodiment of a first portion of an operational amplifier 200, according to various embodiments of the invention. The first portion of the operational amplifier 200 includes a reference bias module 110, a low threshold input module 120, and a low threshold protection module 130.

In one embodiment, the reference bias module 110 generates a positive bias level on a positive bias node 115-1 and a negative bias level on a negative bias node 115-2. A current source 212 is connected between a source voltage node 102 and the negative bias node 115-2. The current source 212 sources current to a first reference NMOS transistor 214-1, connected between the negative bias node 115-2 and a ground node 204. It will be appreciated that, although various circuits are described herein as being connected with a ground node 204, some embodiments may, in fact be connected to different voltage levels (e.g., a negative voltage node). For example, the ground node 204 may actually be held at a voltage that is substantially negative of the level at the source voltage node 202. In those embodiments, certain circuit components and/or topologies may be modified accordingly.

The current from the current source 212 is mirrored to a reference PMOS transistor 216, connected between the source voltage node 202 and the positive bias node 115-1, via a second reference NMOS transistor 214-2. The second reference NMOS transistor 214-2 is connected between the positive bias node 115-1 and ground, with its gate driven by the negative bias level at the negative bias node 115-2. It will be appreciated that, in this topology, the reference NMOS transistors 214 are biased by the negative bias level and the reference PMOS transistor 216 is biased by the positive bias level.

The low threshold input module 120 is in communication with a positive input node 105-1 and a negative input node 105-2. The negative input node 105-2 drives the gate of a first low threshold NMOS transistor 222-1, and the positive input node 105-1 drives the gate of a second low threshold NMOS transistor 222-2. The drain of each low threshold NMOS transistor 222 is connected to the source voltage node 202.

The source of each of the first low threshold NMOS transistor 222-1 and the second low threshold NMOS transistor 222-2 is biased (e.g., pulled down) by a first biasing NMOS transistor 226-1 and a second biasing NMOS transistor 226-2, respectively, each having a gate driven by the negative bias level.

In some embodiments, each of the low threshold NMOS transistors 222 is configured as a source follower for driving the bulk of a respective PMOS transistor 224. Driving the bulk of the PMOS transistors 224 may provide certain functionality. For example, the bulk-driven components may reduce or eliminate certain dead zones, which may be present where complementary NMOS and PMOS gate driven transistors are used. Further, using source follower configurations to drive the bulks of the PMOS transistors 224 may buffer the input nodes 105 from the PMOS bulk terminals. This may minimize excess bulk currents when the inputs of the input stages are connected to noisy signals (e.g., having substantial undershoot or overshoot).

Embodiments of the low threshold input module 120 are optimized for operation in low common mode voltage conditions by implementing the low threshold NMOS transistors 222 using low threshold devices. In the illustrated embodiment, native NMOS devices are used. In other embodiments, other low threshold devices may be used, including negative threshold devices, like depletion-mode transistors.

The bulk-driven PMOS transistors 224 are biased (e.g., pulled up) by a first biasing PMOS transistor 228-1, connected to the source voltage node 202 and having a gate driven by the positive bias level. The gates of the bulk-driven PMOS transistors 224 are connected to the ground node 204. The drain of the first PMOS transistor 224-1 (its bulk driven by the source of the first low threshold NMOS transistor 222-1) generates an output level (e.g., a current) on a positive differential output node 125-1. The drain of the second PMOS transistor 224-2 (its bulk driven by the source of the second low threshold NMOS transistor 222-2) generates an output level (e.g., a current) on a negative differential output node 125-2.

It will be appreciated that, in this configuration, the low threshold input module 120 acts substantially as a current steering block. For example, current levels at the output nodes 125 is functionally related to the levels at the input nodes 105. It will be appreciated that the input common mode range for an NMOS device may be greater than or equal to its threshold voltage, and the input common mode range for a PMOS may be less than or equal to the voltage at the source voltage node 202 less the absolute value of its threshold voltage. When used differentially, a condition may arise forcing the voltage at the source voltage node 202 to be greater than or equal to the sum of the NMOS threshold voltage and the absolute value of the PMOS threshold voltage. For example, the NMOS and PMOS input stages may effectively be complementary stages stacked on top of each other, so that the minimum headroom for proper operation becomes the sum of the individual threshold voltages. As such, the operational amplifier 100 may not operate desirably at low voltages on the source voltage node 202 or at high device threshold voltages.

As illustrated, embodiments of the low threshold input module 120 drive the bulks of the PMOS transistors 224, which may increase the operational range of the operational amplifier 100. However, configuring the PMOS transistors 224 as bulk-driven devices may also allow certain parasitic effects to occur. One such parasitic effect is illustrated by parasitic bipolar devices 232. The parasitic bipolar devices 232 are illustrated for clarity of disclosure only, and intend to represent apparent effects, rather than physical components.

These parasitic bipolar devices 232 may be inherently present in any PMOS device implemented in an N-well technology. For example, a typical CMOS design may connect the N-well of a PMOS device (i.e., the base of the PNP structure of the device) to a voltage greater than or equal to the source of the PMOS device (i.e., the emitter of the PNP structure of the device). This may prevent the parasitic PNP effects of the device from turning on. Driving the N-wells of the PMOS transistors 224 to act as differential signals, however, may cause the parasitic bipolar devices 232 to effectively turn on when the sources of the PMOS transistors 224 (i.e., the emitter of the parasitic bipolar device 232) exceed the bulks of the PMOS transistors 224 (i.e., the base of the parasitic bipolar device 323) by a certain amount (e.g., their respective $V_{BE}$).

As illustrated, a first parasitic bipolar device 232-1 is apparently connected between the source of the first PMOS transistor 224-1 and the ground node 204, with its base apparently driven by the bulk of the first PMOS transistor 224-1. A third parasitic bipolar device 232-3 is apparently connected between the source of the second PMOS transistor 224-2 and the ground node 204, with its base apparently driven by the bulk of the second PMOS transistor 224-2. For example, the first parasitic bipolar device 232-1 and the third parasitic bipolar device 232-3 are parasitic vertical PNP transistors whose collectors are connected to the substrate. A second parasitic bipolar device 232-2 is apparently connected between the source of the first PMOS transistor 224-1 and the drain of the first PMOS transistor 224-1, with its base apparently driven by the bulk of the first PMOS transistor 224-1. A fourth parasitic bipolar device 232-4 is apparently connected between the source of the second PMOS transistor 224-2 and the drain of the second PMOS transistor 224-2, with its base apparently driven by the bulk of the second PMOS transistor 224-2. For example, the second parasitic bipolar device 232-2 and the fourth parasitic bipolar device 232-4 are parasitic lateral PNP transistors whose collectors are connected to the drains of the first PMOS transistor 224-1 and the second PMOS transistor 224-2, respectively.

As illustrated, the first parasitic bipolar device 232-1 and the second parasitic bipolar device 232-2 have a common source and a common base, and the third parasitic bipolar device 232-3 and the fourth parasitic bipolar device 232-4 have a common source and a common base. When the base-emitter voltage of each pair of parasitic bipolar devices 232 is forward biased (e.g., "turned on") then the amount of collector current through the parasitic bipolar devices 232 may be dependent on the beta of each respective parasitic bipolar device 232 (i.e., the current gain of these devices). For example, where the first parasitic bipolar device 232-1 is an apparent vertical transistor, the beta may depend on its base width, which may be determined by its emitter junction depth and the thickness of the N-well region directly underneath it. Where the second parasitic bipolar device 232-2 is an apparent lateral transistor, the beta may depend on its base width and may be equal to the equivalent length of the PMOS transistor (i.e., the first PMOS transistor 224-1). The betas of these devices may also depend on the doping of the N-well at the surface (e.g., for the lateral PNP) and the doping beneath the surface (e.g., in the N-well underneath the emitter for the vertical PNP). In various embodiments, the vertical and lateral betas, as well as matching between device structures (i.e., the PMOS transistors 224 and their respective parasitic bipolar devices 232), may depend on the layout and/or process used to physically implement the low threshold input module 120 (e.g., the integrated circuit manufacturing process).

It will be appreciated that vertical and lateral currents (i.e., currents through the parasitic bipolar devices 232) may not be well controlled, which may cause undesirable results in the operation of the low threshold input module 120. Further, effects of the parasitic bipolar devices 232 may increase as the common mode voltage decreases. For example, as described above, each PMOS transistor 224 can be considered as a composite device that includes the PMOS transistor 224 and two parasitic bipolar devices 232 (e.g., apparent vertical and lateral bipolar transistors). Because of the current steering topology of the low threshold input module 120, current flow through one composite device (e.g., the composite effect of devices 224-1, 232-1, and 232-2) may depend on the beta ratio of its respective parasitic bipolar devices (e.g., 232-1 and 232-2) and how well its characteristics match those of the other composite device (e.g., the composite effect of devices 224-2, 232-3, and 232-4). If these various effects are not well matched, the result may be large gain errors, linearity errors, and/or offset errors at low common mode voltages. Effects of the parasitic bipolar devices 232 may be mitigated by gradually and controllably turning off the PMOS transistors 224 as the common mode voltage decreases.

In some embodiments, the low threshold protection module 130 is configured to gradually and controllably turn off the PMOS transistors 224 as the common mode voltage decreases. The low threshold protection module 130 may be implemented with a topology that substantially replicates portions of the low threshold input module 120. In the embodiment shown, the low threshold protection module 130 is configured to substantially replicate half of the low threshold input module 120, but modified to generate a protection control level at a low threshold protection control node 235.

The positive input node 105-1 drives the gate of a low threshold protection NMOS transistor 234. The drain of the low threshold protection NMOS transistor 234 is connected to the source voltage node 202, and the source is biased (e.g., pulled down) by a third biasing NMOS transistor 226-3, having a gate driven by the negative bias level. The low threshold protection NMOS transistor 234 is configured as a source follower for driving the bulk of a protection PMOS transistor 236. Embodiments of the low threshold protection NMOS transistor 234 are implementing using low threshold devices (e.g., native NMOS transistors).

The bulk-driven protection PMOS transistor 236 is biased between a second biasing PMOS transistor 228-2 (connected to the source voltage node 202 and having a gate driven by the positive bias level) and a fourth biasing NMOS transistor 226-4 (connected to the ground node 204 and having a gate driven by the negative bias level). The gate of the bulk-driven protection PMOS transistor 236 is connected to the ground node 204. The drain of the bulk-driven protection PMOS transistor 236 generates an output level (e.g., a current) on the low threshold protection control node 235, which is in communication with the sources of the PMOS transistors 224.

As in the low threshold input module 120, parasitic bipolar effects may be apparent in certain conditions. A fifth parasitic bipolar device 232-5 is apparently connected between the source of the protection PMOS transistor 236 and the ground node 204, with its base apparently driven by the bulk of the protection PMOS transistor 236. A sixth parasitic bipolar device 232-6 is apparently connected between the source of the protection PMOS transistor 236 and the drain of the protection PMOS transistor 236, with its base apparently driven by the bulk of the protection PMOS transistor 236. Because of the substantially replicated topology, effects of the fifth parasitic bipolar device 232-5 and the sixth parasitic bipolar device 232-6 may be substantially identical to the effects of the third parasitic bipolar device 232-3 and the fourth parasitic bipolar device 232-4, respectively.

As the parasitic effects occur, effects on the low threshold protection control node 235 may be related to effects on the output nodes 125. Connecting the low threshold protection control node 235 with the sources of the PMOS transistors 224 may counteract the parasitic effects. For example, the level on the low threshold protection control node 235 may be used to gradually and controllably turn off the PMOS transistors 224 as the common mode voltage decreases.

In the embodiment shown, during normal operation (e.g., when the common mode voltage is higher than a certain level), the current flowing through the protection PMOS transistor 236 is substantially identical to the current flowing through the fourth biasing NMOS transistor 226-4. When the common mode voltage drops to a sufficiently low level, parasitic effects of the third parasitic bipolar device 232-3 and the fourth parasitic bipolar device 232-4 begin to turn on (i.e., the devices begin to be forward biased), causing substantially replicated effects to begin to appear on the fifth parasitic bipolar device 232-5 and the sixth parasitic bipolar device 232-6. Current may begin to be shunted through the fifth parasitic bipolar device 232-5, thereby reducing the total current flow through the sixth parasitic bipolar device 232-6 and the protection PMOS transistor 236. Since the current through the fourth biasing NMOS transistor 226-4 is substantially constant, a net current begins to flow into the low threshold protection control node 235. This may effectively reduce the current available to the PMOS transistors 224, which may, in turn, reduce their effect on the operation of the operational amplifier 100.

It will be appreciated that the point at which current is shunted away from the PMOS transistors 224 may be affected by changing sizing and/or by changing gate biasing of components of the low threshold protection module 130. For example, the current-stealing effects of the low threshold protection module 130 may occur at a higher positive input node 105-1 levels if the gate voltage of the protection PMOS transistor 236 is adjusted to a higher voltage and/or if the saturation voltage of the protection PMOS transistor 236 is increased. The saturation voltage of the protection PMOS transistor 236 may be increased, for instance, by using a smaller W/L ratio for the protection PMOS transistor 236 (e.g., as compared to the W/L ratio for the PMOS transistors 224) and/or by increasing the current through the fourth biasing NMOS transistor 226-4 and the second biasing PMOS transistor 228-2 (e.g., and therefore through the protection PMOS transistor 236).

In some embodiments, the threshold voltages for the PMOS transistors 224 are negative enough such that the sources of the PMOS transistors 224 remain sufficiently positive (e.g., about 150-200 mV) over substantially the entire operational common mode range of the operational amplifier 100. This may prevent the parasitic bipolar devices 232 from ever becoming forward biased, thereby preventing them from ever turning on. In these embodiments, the parasitic effects of the parasitic bipolar devices 232 may not manifest during operation of the operational amplifier 100. For at least this reason, some embodiments of the first portion of the operational amplifier 200 are implemented without a protection circuit.

In some embodiments, the first portion of the operational amplifier 200 shown in FIG. 2 is used in conjunction with a second portion, as shown in FIG. 3. FIG. 3 shows a schematic diagram of an embodiment of a second portion of an operational amplifier 300, according to various embodiments of the invention. The second portion of the operational amplifier 300 includes a high threshold input module 140 and a high threshold protection module 150. In some embodiments, the modules of the second portion of the operational amplifier 300 are biased by a positive bias level on a positive bias node 115-1 and a negative bias level on a negative bias node 115-2. In certain embodiments, the bias levels are generated by a reference bias module 110, like the reference bias module 110 shown in FIG. 2. It will be appreciated that the phrase "high threshold," as used herein, is intended broadly to refer to threshold voltages that are higher than those of the low threshold devices. For example, some "high threshold" devices are implemented as regular MOS devices (e.g., enhancement-mode devices) having typical threshold voltages for those devices.

Embodiments of the high threshold input module 140 and the high threshold protection module 150 are implemented substantially identically to implementations of the low threshold input module 120 and the low threshold protection module 130, respectively. In some embodiments, the topologies of the respective modules are identical, except that the low threshold devices of the low threshold modules (120 and 130) are implemented as higher threshold devices in the high threshold modules (140 and 150). For example, the first low threshold NMOS transistor 222-1, the second low threshold NMOS transistor 222-2, and the low threshold protection NMOS transistor 234 are replaced by a first high threshold NMOS transistor 242-1, a second high threshold NMOS transistor 242-2, and a high threshold protection NMOS transistor 254.

The high threshold input module 140 is in communication with a positive input node 105-1 and a negative input node 105-2. The negative input node 105-2 drives the gate of a first high threshold NMOS transistor 242-1, and the positive input node 105-1 drives the gate of a second high threshold NMOS transistor 242-2. The drain of each high threshold NMOS transistor 242 is connected to the source voltage node 202. The source of each of the first high threshold NMOS transistor 242-1 and the second high threshold NMOS transistor 242-2 is biased (e.g., pulled down) by a first biasing NMOS transistor 246-1 and a second biasing NMOS transistor 246-2, respectively, each having a gate driven by the negative bias level.

In some embodiments, each of the high threshold NMOS transistors 242 is configured as a source follower for driving the bulk of a respective PMOS transistor 244. Embodiments of the high threshold input module 120 are optimized for operation in higher common mode voltage conditions (e.g., higher than the voltage range for which the low threshold modules are optimized) by implementing the high threshold NMOS transistors 242 using higher threshold devices. In the illustrated embodiment, regular NMOS devices are used.

The bulk-driven PMOS transistors 244 are biased (e.g., pulled up) by a first biasing PMOS transistor 248-1, connected to the source voltage node 202 and having a gate driven by the positive bias level. The gates of the bulk-driven PMOS transistors 244 are connected to the ground node 204. The drain of the first PMOS transistor 244-1 (its bulk driven by the source of the first high threshold NMOS transistor 242-1) generates an output level (e.g., a current) on the positive differential output node 125-1. The drain of the second PMOS transistor 244-2 (its bulk driven by the source of the second high threshold NMOS transistor 242-2) generates an output level (e.g., a current) on the negative differential output node 125-2. In some embodiments, the differential output nodes 125 are tied both to the drains of the PMOS transistors 244 and to the drains of the PMOS transistors 224 of the low threshold input module 120 of FIG. 2.

As explained above with reference to FIG. 2, certain parasitic effects may be seen, for example, as the common mode voltage decreases below a certain level. As in FIG. 2, one such parasitic effect is illustrated by parasitic bipolar devices 252. The parasitic bipolar devices 252 are illustrated for clarity of disclosure only, and intend to represent apparent effects, rather than physical components.

As illustrated, a first parasitic bipolar device 252-1 is apparently connected between the source of the first PMOS transistor 244-1 and the ground node 204, with its base apparently driven by the bulk of the first PMOS transistor 244-1. A third parasitic bipolar device 252-3 is apparently connected between the source of the second PMOS transistor 244-2 and the ground node 204, with its base apparently driven by the bulk of the second PMOS transistor 244-2. For example, the first parasitic bipolar device 252-1 and the third parasitic bipolar device 252-3 are parasitic vertical PNP transistors whose collectors are connected to the substrate. A second parasitic bipolar device 252-2 is apparently connected between the source of the first PMOS transistor 244-1 and the drain of the first PMOS transistor 244-1, with its base apparently driven by the bulk of the first PMOS transistor 244-1. A fourth parasitic bipolar device 252-4 is apparently connected between the source of the second PMOS transistor 244-2 and the drain of the second PMOS transistor 244-2, with its base apparently driven by the bulk of the second PMOS transistor 244-2. For example, the second parasitic bipolar device 252-2 and the fourth parasitic bipolar device 252-4 are parasitic lateral PNP transistors whose collectors are connected to the drains of the first PMOS transistor 244-1 and the second PMOS transistor 244-2, respectively.

It will be appreciated that the parasitic bipolar devices 252 shown in FIG. 3 may affect operation of the second portion of the operational amplifier 300 in much the same way as the parasitic bipolar devices 232 shown in FIG. 2 affect operation of the first portion of the operational amplifier 300, as described above with respect to FIG. 2 (where the low threshold protection module 130 is included). For example, vertical and lateral currents (i.e., currents through the parasitic bipolar devices 252) may not be well controlled, which may cause undesirable results in the operation of the high threshold input module 140. Further, effects of the parasitic bipolar devices 252 may increase as the common mode voltage decreases. Effects of the parasitic bipolar devices 252 may be mitigated by gradually and controllably turning off the PMOS transistors 244 as the common mode voltage decreases.

In some embodiments, the high threshold protection module 150 is configured to gradually and controllably turn off the PMOS transistors 244 as the common mode voltage decreases. The high threshold protection module 150 may be implemented with a topology that substantially replicates portions of the high threshold input module 140. In the embodiment shown, the high threshold protection module 150 is configured to substantially replicate half of the high threshold input module 140, but modified to generate a protection control level at a high threshold protection control node 255.

The positive input node 105-1 drives the gate of a high threshold protection NMOS transistor 254. The drain of the high threshold protection NMOS transistor 254 is connected to the source voltage node 202, and the source is biased (e.g., pulled down) by a third biasing NMOS transistor 246-3, having a gate driven by the negative bias level. The high threshold protection NMOS transistor 254 is configured as a source follower for driving the bulk of a high threshold protection PMOS transistor 256. Embodiments of the high threshold protection NMOS transistor 254 are implementing using high threshold devices (e.g., regular NMOS transistors).

The bulk-driven protection PMOS transistor 256 is biased between a second biasing PMOS transistor 248-2 (connected to the source voltage node 202 and having a gate driven by the positive bias level) and a fourth biasing NMOS transistor 246-4 (connected to the ground node 204 and having a gate driven by the negative bias level). The gate of the bulk-driven protection PMOS transistor 256 is connected to the ground node 204. The drain of the bulk-driven protection PMOS transistor 256 generates an output level (e.g., a current) on the high threshold protection control node 255, which is in communication with the sources of the PMOS transistors 244.

As in the high threshold input module 120, parasitic bipolar effects may be apparent in certain conditions. A fifth parasitic bipolar device 252-5 is apparently connected between the source of the protection PMOS transistor 256 and the ground node 204, with its base apparently driven by the bulk of the protection PMOS transistor 256. A sixth parasitic bipolar device 252-6 is apparently connected between the source of the protection PMOS transistor 256 and the drain of the protection PMOS transistor 256, with its base apparently driven by the bulk of the protection PMOS transistor 256. Because of the substantially replicated topology, effects of the fifth parasitic bipolar device 252-5 and the sixth parasitic bipolar device 252-6 may be substantially identical to the effects of the third parasitic bipolar device 252-3 and the fourth parasitic bipolar device 252-4, respectively.

As the parasitic effects occur, effects on the high threshold protection control node 255 may be related to effects on the output nodes 125. Connecting the high threshold protection control node 255 with the sources of the PMOS transistors 244 may counteract the parasitic effects. For example, the level on the high threshold protection control node 255 may be used to gradually and controllably turn off the PMOS transistors 244 as the common mode voltage decreases.

In the embodiment shown, during normal operation (e.g., when the common mode voltage is higher than a certain level), the current flowing through the protection PMOS transistor 256 is substantially identical to the current flowing through the fourth biasing NMOS transistor 246-4. As such, the net current flowing through the high threshold protection control node 255 is substantially zero. When the common mode voltage drops to a sufficiently low level, parasitic effects of the third parasitic bipolar device 252-3 and the fourth parasitic bipolar device 252-4 begin to turn on (i.e., the devices begin to be forward biased), causing substantially replicated effects to begin to appear on the fifth parasitic bipolar device 252-5 and the sixth parasitic bipolar device 252-6. Current may begin to be shunted through the fifth parasitic bipolar device 252-5, thereby reducing the total current flow through the sixth parasitic bipolar device 252-6 and the protection PMOS transistor 256. Since the current through the fourth biasing NMOS transistor 246-4 is substantially constant, a net current begins to flow into the high threshold protection control node 255. This may effectively reduce the current available to the PMOS transistors 244, which may, in turn, reduce their effect on the operation of the operational amplifier 100.

As illustrated in FIG. 1, embodiments of operational amplifiers may include an output module (e.g., output module 400 of FIG. 1) for generating a single-ended output signal with certain output characteristics as a function of the levels on the differential output nodes 125. FIG. 4 shows a schematic diagram of an embodiment of an output module 400 of an operational amplifier, according to various embodiments of the invention. The output module 400 includes a summing module 410 and an output gain module 420. The summing module 410 generates a single-ended output level as a function of a positive differential output node 125-1 and a negative differential output node 125-2 (e.g., the differential output nodes 125 of FIGS. 2 and 3). The output gain module 420 generates an output signal at an output node 175 as a function of the single-ended output level.

In one embodiment, the summing module 410 is implemented as a folded cascode topology. A first pair of transistors includes a first PMOS transistor 412-1 and a second PMOS transistor 412-2. The first PMOS transistor 412-1 is connected between the source voltage terminal 202 and the source of the second PMOS transistor 412-2. The gate of the first PMOS transistor 412-1 is connected to an intermediate node 415. The gate of the second PMOS transistor 412-2 is driven by a first voltage source 416-1, and the drain of the second PMOS transistor 412-2 is connected to the intermediate node 415.

A second pair of transistors include a first NMOS transistor 414-1 and a second NMOS transistor 414-2. The gate of the first NMOS transistor 414-1 is driven by a second voltage source 416-2, the drain of the first NMOS transistor 414-1 is connected to the intermediate node 415, and the source of the first NMOS transistor 414-1 is connected to the positive differential output node 125-1. The gate of the second NMOS transistor 414-2 is driven by an externally generated negative bias level (e.g., received at a negative bias node 115-2). In some embodiments, the negative bias node 115-2 is in communication with the negative bias node 115-2 of FIGS. 1, 2, and/or 3. The drain of the second NMOS transistor 414-2 is connected to the positive differential output node 125-1, and the source of the second NMOS transistor 414-2 is connected to a ground terminal 204.

A third pair of transistors includes a third PMOS transistor 412-3 and a fourth PMOS transistor 412-4. The third PMOS transistor 412-3 is connected between the source voltage terminal 202 and the source of the fourth PMOS transistor 412-4, with the gate of the third PMOS transistor 412-3 connected to the intermediate node 415. The gate of the fourth PMOS transistor 412-4 is driven by the first voltage source 416-1, and the drain of the fourth PMOS transistor 412-4 is connected to a summing output node 425.

A fourth pair of transistors include a third NMOS transistor 414-3 and a fourth NMOS transistor 414-4. The gate of the third NMOS transistor 414-3 is driven by a second voltage source 416-2, the drain of the third NMOS transistor 414-3 is connected to the drain of the fourth PMOS transistor 412-4 (i.e., at the summing output node 425), and the source of the third NMOS transistor 414-3 is connected to the negative differential output node 125-2. The gate of the fourth NMOS transistor 414-4 is driven by the externally generated negative bias level. The drain of the fourth NMOS transistor 414-4 is connected to the negative differential output node 125-2, and the source of the fourth NMOS transistor 414-4 is connected to the ground terminal 204.

In some embodiments, the summing output node 425 of the summing module 410 is in communication with the output gain module 420. For example, the signal at the summing output node 425 may represent a single-ended representation of the differential outputs seen on the differential output nodes 125. The output gain module 420 may receive the single-ended output signal and apply certain output characteristics to the signal with respect to the output node 175 of the output gain module 420, including, for example, gain, output impedance, etc.

In the embodiment shown, the output gain module 420 includes a fifth PMOS transistor 412-5 and a fifth NMOS transistor 414-5. The source of the fifth PMOS transistor 412-5 is connected to the source voltage terminal 202, the drain of the fifth PMOS transistor 412-5 is connected to the output node 175, and the gate of the fifth PMOS transistor 412-5 is connected to the summing output node 425. The drain of the fifth NMOS transistor 414-5 is connected to the drain of the fifth PMOS transistor 412-5 (i.e., at the output node 175), the source of the fifth NMOS transistor 414-5 is connected to the ground terminal 204, and the gate of the fifth NMOS transistor 414-5 is connected to the negative bias level.

It will be appreciated that various topologies, components, configurations, etc. may be used, according to various embodiments of the invention, to provide different output characteristics. For example, in some embodiments, the output gain module includes a stabilizing capacitor 422. The stabilizing capacitor 422 may be desirable in certain applications, like where the output level seen at the output node 175 is fed back to the negative input node 105-2. This and other closed-loop configurations may be used, for example, where an operational amplifier according to embodiments of the invention is used as a unity-gain buffer.

It will be now be appreciated that embodiments of the circuits shown in FIGS. 2-4 may be arranged to form embodiments of operational amplifiers, like the operational amplifier 100 of FIG. 1. Embodiments of the low threshold modules (e.g., 120 and 130) may deliver high gain performance in both low and middle common mode ranges. Embodiments of the high threshold modules (e.g., 140 and 150) may deliver high gain performance in both high and middle common mode ranges. Using the stages in parallel, along with functionality provided by the protection modules (e.g., 130 and 150) and output modules (e.g., 170, 410, and/or 420), may provide desired common mode functionality across substantially the entire common mode range of the operational amplifier (e.g., 100).

Figure 5:
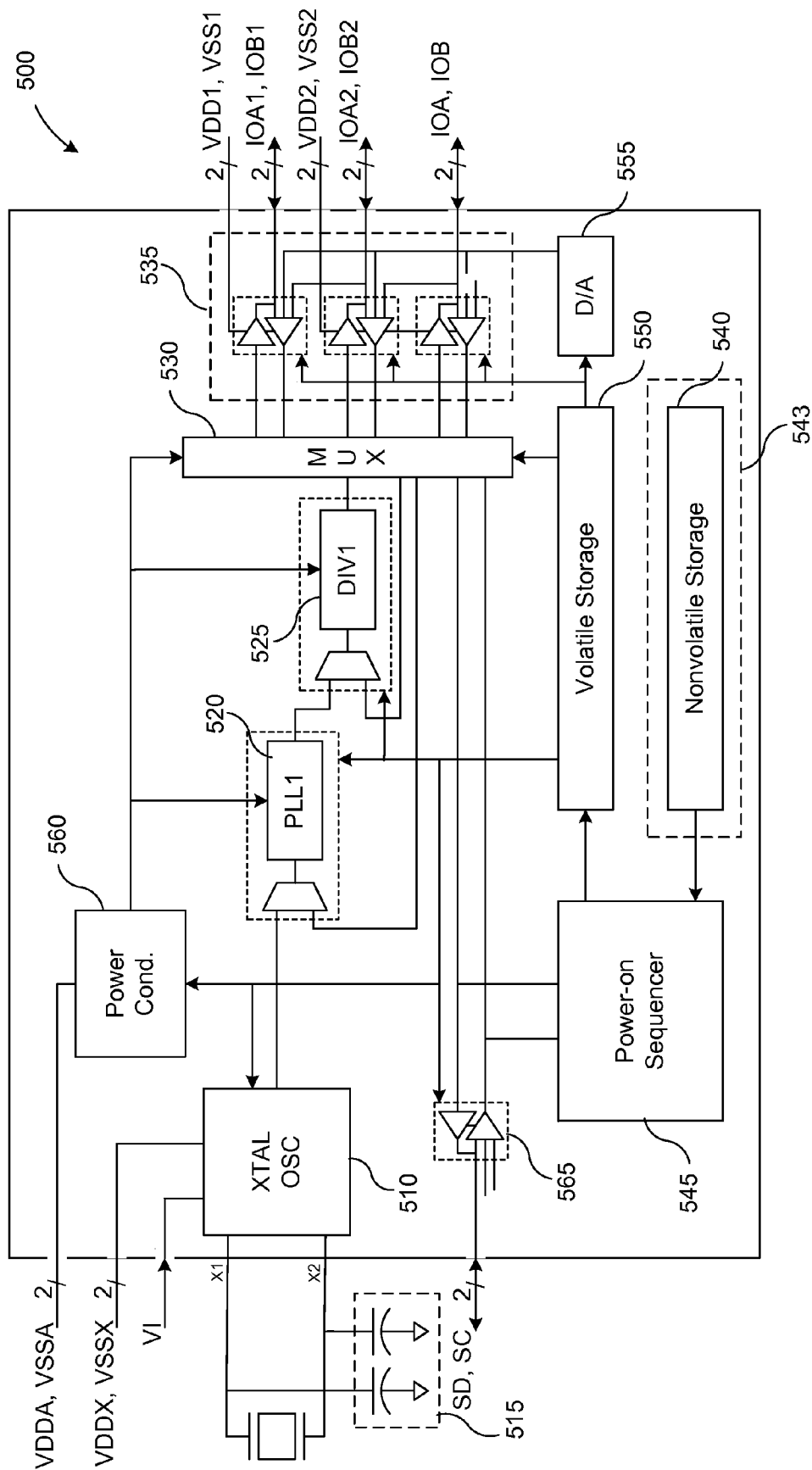
FIG. 5 illustrates a simplified block diagram of a clock circuit arrangement, for use with various embodiments of the invention.

It will be further appreciated that modifications may be made to the implementations embodied in FIGS. 1-4, without departing from the scope of the invention. For example, embodiments of the operational amplifier 100 of FIG. 1 and/or various embodiments of operational amplifier modules illustrated in FIGS. 2-4 may be incorporated into a larger system or circuit arrangement. FIG. 5 illustrates a simplified block diagram of a clock circuit arrangement 500, for use with various embodiments of the invention.

An external crystal is connected to a voltage controlled crystal oscillator ("VCXO") 510 in an exemplary embodiment. A pair of capacitors 515 connect crystal oscillator inputs X1, X2 to ground. VCXO power ("VDDX"), VCXO ground ("VSSX"), and VCXO input voltage ("VI") are external inputs to the VCXO 510. In some embodiments, the VCXO 510 is implemented according to an embodiment of the present invention. For example, embodiments of oscillator control system 100 of FIG. 1 and/or the oscillator control circuit 200 of FIG. 2 may be included in implementations of the VCXO 510 to provide functionality of the crystal oscillator.

An output of the VCXO 510 is connected with an input multiplexer ("mux") of a phase lock loop (PLL1) 520, providing a reference signal for the PLL 520. In some embodiments, additional PLLs 520 may be used to allow for additional I/Os and further programmability. An output of the phase lock loop 520 is connected with the input multiplexer of a PLL divider ("DIV1") 525. An output of the PLL divider 525 is fed to a MUX 530. A first set of outputs of the MUX 530 are connected with programmable input/output buffers 535. Additional outputs from the MUX 530 may be connected with the input mux of PLL1 520 and the input mux of the PLL divider 525.

The clock generator circuit 500, including a nonvolatile storage array 540, may be fabricated, for example, in a single monolithic semiconductor substrate or alternately, the nonvolatile storage array 540 may reside on a second semiconductor substrate 543. An output of the nonvolatile storage array 540 may be in communication with a power-on sequencer 545. The power-on sequencer 545 may communicate with a volatile storage array 550.

The volatile storage array 550 is in communication with a digital-to-analog ("D/A") block 555, a power conditioner block 560, a serial input/output ("I/O") block 565, the programmable input/output buffers 535, the mux 530, the PLL 520, the PLL divider 525, and the VCXO 510. The serial I/O block 565 communicates with serial data and serial clock inputs SD, SC, the power-on sequencer 545, and the MUX 530. The power conditioner block 560 is connected with PLL power inputs VDDA, VSSA.

In one embodiment, an operational amplifier according to an embodiment of the invention (e.g., the operational amplifier 100 of FIG. 1) is included in the VCXO 510. For example, the operational amplifier 100 may differentiate a feedback voltage with a reference voltage and produce a control voltage, which in turn may influence the feedback voltage in a closed-loop fashion. It may be desirable to use the operational 100 amplifier with rail-to-rail input characteristics to maintain operational requirements of the VCXO 510 across a wide range of operating frequencies, at low level supply voltages, during startup conditions, etc. In another embodiment, the operational amplifier 100 may be included in a functional element, such as the power conditioner block 560. In yet another embodiment, a gain stage of the VCXO 510 or the power conditioner block 560 includes the operational amplifier 100.

Figure 6:
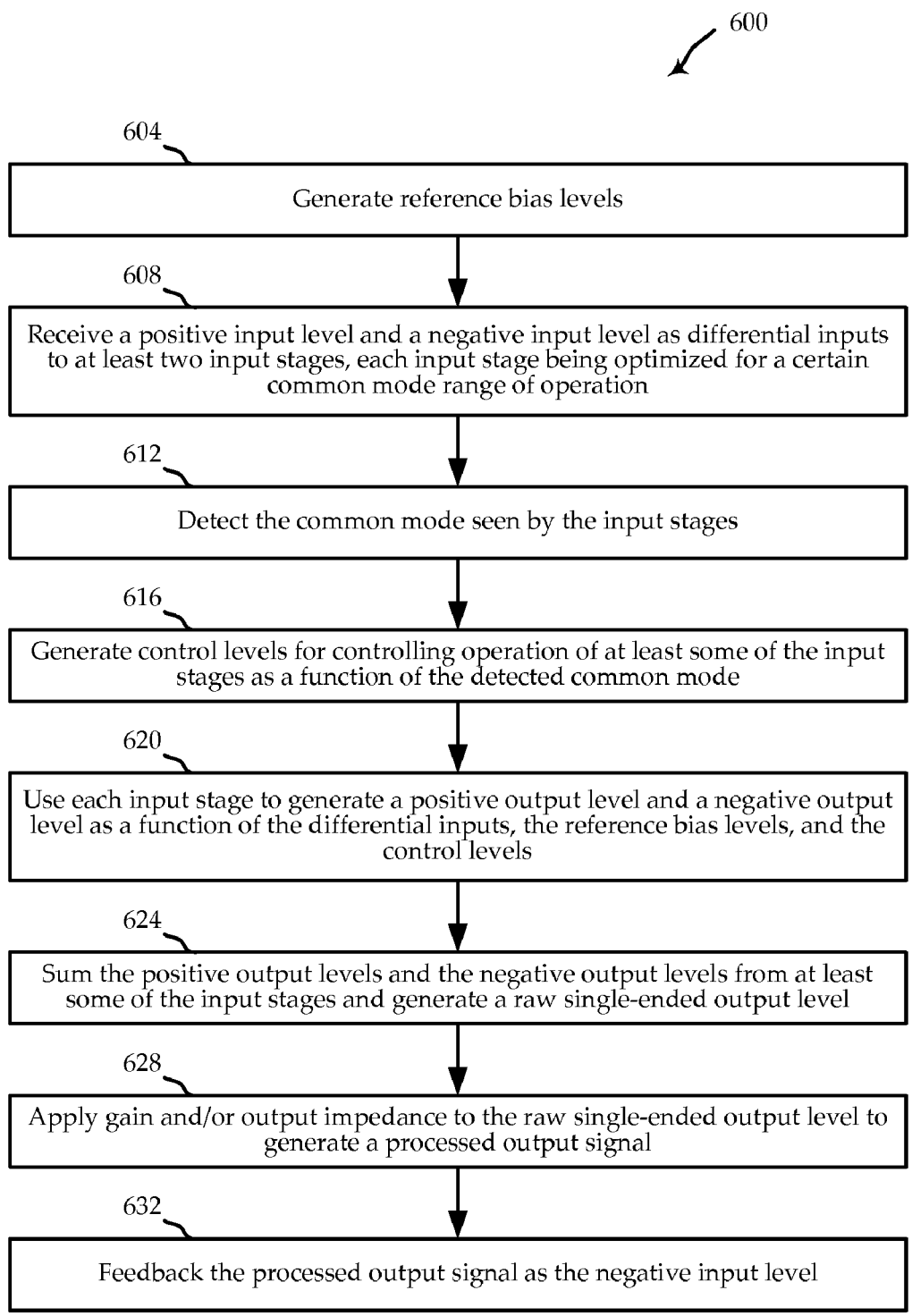
FIG. 6 shows a flow diagram of a method for providing operational amplifier functionality having desirable gain characteristics across substantially an entire common mode range, according to various embodiments of the invention.

It will be appreciated that the circuits described above provide only exemplary systems for providing functionality according to embodiments of the invention. For example, those and other embodiments may be used to perform the method of FIG. 6. FIG. 6 shows a flow diagram of a method 600 for providing operational amplifier functionality having desirable gain characteristics across substantially an entire common mode range, according to various embodiments of the invention.

In some embodiments, the method begins at block 604 by generating reference bias levels. For example, a positive bias level and a negative bias level may be generated. In block 608, a positive input level and a negative input level are received as differential inputs to at least two input stages. Each input stage may be optimized for a certain common mode range of operation. In certain embodiments, two input stages are provided; the first input stage is optimized for low common mode ranges of operations, and the second input stage is optimized for higher common mode ranges of operations. In other embodiments, different numbers of input stages are used having different common mode optimizations (e.g., or other characteristics) to provide desirable common mode gain response across certain portions or the entirety of the operational amplifier's common mode range.

In some embodiments, a common mode seen by the input stages is detected at block 612. The common mode may represent half the sum of the positive input level and the negative input level. At block 616, control levels for controlling operation of at least some of the input stages are generated as a function of the detected common mode. Each input stage is used at block 620 to generate a positive output level and a negative output level. In some embodiments, the output levels are generated as a function of the differential inputs and the reference bias levels. In other embodiments, the output levels are further generated as a function of the control levels generated in block 616. For example, the control levels may effectively cause current to be stolen from the respective input stage, thereby minimizing its effect on the output levels.

At block 624, the positive output levels and the negative output levels from at least some of the input stages are summed, and a raw single-ended output level is generated. In some embodiments, the raw output level is used externally (e.g., by other methods, systems, etc.). In other embodiments, the raw output level is further processed at block 628. For example, gain and/or output impedance may be applied to give the output level desired output characteristics. In certain embodiments, the processed output signal is fed back for use as the negative input level (i.e., received at block 608).

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems and methods may individually or collectively be components of a larger system, wherein other procedures may take precedence over or otherwise modify their application. Also, a number of steps may be required before, after, or concurrently with the following embodiments. Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Accordingly, the above description should not be taken as limiting the scope of the invention, which is defined by the appended claims.

What is claimed is:

1. An operational amplifier, comprising:
   a first input module, comprising a first pair of input transistors and a first pair of output transistors, each of the first pair of input transistors having a first threshold voltage;
   a second input module, comprising a second pair of input transistors and a second pair of output transistors, each of the second pair of input transistors having a second threshold voltage, the second threshold voltage being lower than the first threshold voltage,
   wherein each of the first pair of output transistors has a bulk in communication with a respective one of the first pair of input transistors, and each of the second pair of output transistors has a bulk in communication with a respective one of the second pair of input transistors, and each input module is configured to:
      receive a pair of input signals differentially at a pair of input nodes in communication with the first pair of input transistors and the second pair of input transistors;
      use each pair of input transistors to generate a respective pair of bulk levels as a function of the pair of input signals;
      control the bulks of each pair of output transistors as a function of the respective pair of bulk levels; and
      use each pair of output transistors to generate a respective pair of output signals at a pair of output nodes as a function of the respective pair of bulk levels and at least one reference level, the pair of output nodes being in communication with the first pair of output transistors and the second pair of output transistors; and
   a protection module, in communication with the first input module, and configured to generate a protection control signal as a function of at least one of the pair of input signals, wherein each of the pair of output signals generated by the first pair of output transistors has an amplitude that is at least partially controlled as a function of the protection control signal.

2. The operational amplifier of claim 1, wherein:
   the first pair of input transistors includes enhancement-mode NMOS transistors; and
   the second pair of input transistors includes native NMOS transistors.

3. The operational amplifier of claim 1, wherein:
   the first pair of input transistors includes enhancement-mode NMOS transistors; and
   the second pair of input transistors includes depletion-mode NMOS transistors.

4. The operational amplifier of claim 1, wherein:
   the first pair of input transistors and the second pair of input transistors include NMOS transistors; and
   the first pair of output transistors and the second pair of output transistors include PMOS transistors.

5. The operational amplifier of claim 4, wherein:
   the first pair of output transistors manifest a parasitic bipolar effect when a common mode input level is below a threshold level, the common mode input level being defined as half the magnitude of the sum of the pair of input signals; and
   the protection module is configured to at least partially compensate for the parasitic bipolar effect.

6. The operational amplifier of claim 4, wherein:
   each of the first pair of input transistors has a drain, a source, and a gate;
   the drain of each of the first pair of input transistors is coupled with a source voltage terminal;
   the source of a first one of the first pair of input transistors is coupled with the bulk of a first one of the first pair of output transistors;
   the source of a second one of the first pair of input transistors is coupled with the bulk of a second one of the first pair of output transistors;
   the gate of the first one of the first pair of input transistors is coupled with a first one of the pair of input nodes;
   the gate of the second one of the first pair of input transistors is coupled with a second one of the pair of input nodes; and
   a drain of each of the first pair of output transistors is coupled with one of the pair of output nodes.

7. The operational amplifier of claim 6, wherein the protection module comprises:
a protection input transistor having a drain coupled with a source voltage terminal, a source coupled with the bulk of a protection output transistor, and a gate coupled with one of the pair of input signals,
wherein a drain of the protection output transistor is coupled with the source of each of the first pair of output transistors.

8. The operational amplifier of claim 1, wherein:
the first pair of input transistors is optimized to operate over a first common mode range defined by a range between a first lower limit and an first upper limit, the first lower limit being defined as a function of the first threshold voltage; and
the second pair of input transistors is optimized to operate over a second common mode range defined by a range between a second lower limit and an second upper limit, the second lower limit being defined as a function of the second threshold voltage,
wherein the second lower limit is lower than the first lower limit.

9. The operational amplifier of claim 1, further comprising:
an output module, configured to generate an amplifier output signal as a function of the first pair of output signals and the second pair of output signals.

10. The operational amplifier of claim 9, wherein the output module comprises:
a summing module, configured to generate a single-ended output signal as a function of summing the first pair of output signals and the second pair of output signals.

11. The operational amplifier of claim 10, wherein the summing module comprises a folded cascode topology.

12. The operational amplifier of claim 9, wherein the output module further comprises:
an output gain module, configured to generate the amplifier output signal at least by applying gain to the single-ended output signal.

13. The operational amplifier of claim 12, wherein the output gain module comprises a capacitive load configured to increase output stabilization in a closed-loop configuration.

14. The operational amplifier of claim 1, further comprising:
a reference generator module, configured to generate the at least one reference level.

15. The operational amplifier of claim 1, further comprising:
a housing, configured to house at least the first input module, the second input module, and the protection module, and comprising a set of interface locations configured to provide external interfaces with at least the pair of input nodes.

16. A method for providing operational amplifier functionality, comprising:
receiving a pair of input signals differentially at a first pair of input devices, the first pair of input devices being optimized to operate over a first common mode range and configured to control bulks of a first respective pair of output devices;
receiving the pair of input signals differentially at a second pair of input devices, the second pair of input devices being optimized to operate over a second common mode range and configured to control bulks of a second respective pair of output devices, the second common mode range being different from the first common mode range;
using each pair of input devices to generate bulk levels at the bulks of each respective pair of output devices as a function of the pair of input signals;
generating a protection control signal as a function of at least one of the pair of input signals;
using the first respective pair of output devices to generate a first pair of output signals as a function of the bulk levels at the bulks of the first respective pair of output devices and the protection control signal; and
using the second respective pair of output devices to generate a second pair of output signals as a function of the bulk levels at the bulks of the second respective pair of output devices.

17. The method of claim 16, further comprising:
generating a set of reference signals, wherein the protection control signal, the first pair of output signals, and the second pair of output signals are generated partially as a function of the reference signals.

18. The method of claim 16, wherein:
each common mode range is defined by a range between a lower limit and an upper limit, and the lower limit of the first common mode range is greater than the lower limit of the second common mode range.

19. The method of claim 16, further comprising:
generating a single-ended output signal as a function of summing the first pair of output signals and the second pair of output signals.

20. The method of claim 19, further comprising:
generating an amplifier output signal by applying gain to the single-ended output signal.

21. The method of claim 20, further comprising:
coupling the amplifier output signal with one of the pair of input signals to create closed-loop feedback.

22. A system for providing operational amplifier functionality, comprising:
a first means for differentially receiving a pair of input signals, the first means being optimized to operate over a first common mode range and configured to generate a first bulk level and a second bulk level as a function of each of the pair of input signals, respectively;
a second means for differentially receiving the pair of input signals, the second means being optimized to operate over a second common mode range and configured to generate a third bulk level and a fourth bulk level as a function of each of the pair of input signals, respectively;
a third means for generating a protection control signal as a function of at least one of the pair of input signals;
a fourth means for generating a first output signal as a function of the first bulk level and the protection control signal;
a fifth means for generating a second output signal as a function of the second bulk level and the protection control signal;
a sixth means for generating a third output signal as a function of the third bulk level; and
a seventh means for generating a fourth output signal as a function of the fourth bulk level.

23. The system of claim 22, further comprising:
an eighth means for generating a single-ended output signal as a function of summing the first output signal, the second output signal, the third output signal, and the fourth output signal.

24. The system of claim 23, further comprising:
a ninth means for applying at least one output characteristic to the single-ended output signal to generate an amplifier output signal.

25. The system of claim 24, further comprising:

a tenth means for housing at least the first means, the second means, the fourth means, the fifth means, the sixth means, and the seventh means, the tenth means comprising an eleventh means for providing an interface between the first means and a source of the pair of input signals external to the tenth means.

* * * * *